US009766489B2

(12) United States Patent
Tanabe et al.

(10) Patent No.: US 9,766,489 B2
(45) Date of Patent: Sep. 19, 2017

(54) MANUFACTURING METHOD FOR LIQUID CRYSTAL DISPLAY DEVICE (71) Applicants: Japan Display Inc., Tokyo (JP); Panasonic Liquid Crystal Display Co., Ltd., Himeji-shi, Hyogo-ken (JP)

(72) Inventors: Hideo Tanabe, Mobara (JP); Masaru Takabatake, Mobara (JP); Toshiki Kaneko, Chiba (JP); Atsushi Hasegawa, Togene (JP); Hiroko Sehata, Ooamishirasoto (JP)

(73) Assignees: JAPAN DISPLAY INC., Tokyo (JP); PANASONIC LIQUID CRYSTAL DISPLAY CO., LTD., Himeji-Shi (JP)

( * ) Notice: Subject to any disclaimer, the term of this patent is extended or adjusted under 35 U.S.C. 154(b) by 59 days.

(21) Appl. No.: 15/002,453

(22) Filed: Jan. 21, 2016

(65) Prior Publication Data

US 2016/0147110 A1    May 26, 2016

Related U.S. Application Data (63) Continuation of application No. 14/679,154, filed on Apr. 6, 2015, now Pat. No. 9,274,364, which is a (Continued)

(30) Foreign Application Priority Data

Jun. 9, 2006 (JP) .................................. 2006-160428

(51) Int. Cl.
G02F 1/1333    (2006.01)
G02F 1/1362    (2006.01)
(Continued)

(52) U.S. Cl.
CPC ...... *G02F 1/133345* (2013.01); *G02F 1/1368* (2013.01); *G02F 1/133305* (2013.01);
(Continued)

(58) Field of Classification Search
CPC ................................................ G01F 1/133345
See application file for complete search history.

(56) References Cited

U.S. PATENT DOCUMENTS 6,362,030 B1    3/2002 Nagayama et al.
6,650,378 B2   11/2003 Kobayashi et al.
(Continued)

FOREIGN PATENT DOCUMENTS

JP    2005-312165       5/1999
JP    2000-267128 A     9/2000
(Continued)

*Primary Examiner* — Zandra Smith
*Assistant Examiner* — Andre' C Stevenson
(74) *Attorney, Agent, or Firm* — Juan Carlos A. Marquez; Marquez IP Law Office, PLLC (57) ABSTRACT A LCD device having a large pixel holding capacitance includes opposedly facing first and second substrates, and liquid crystal between them. The first substrate includes a video signal line, a pixel electrode, a thin film transistor having a first electrode connected to the video signal line and a second electrode connected to the pixel electrode, a first silicon nitride film formed above the second electrode, an organic insulation film above the first silicon nitride film, a capacitance electrode above the organic insulation film, and a second silicon nitride film above the capacitance electrode and below the pixel electrode. A contact hole etched in both the first and second silicon nitride films connects the second electrode and the pixel electrode to each other. A holding capacitance is formed by the pixel electrode, the second silicon nitride film and the capacitance electrode.

11 Claims, 7 Drawing Sheets

Related U.S. Application Data continuation of application No. 14/156,957, filed on Jan. 16, 2014, now Pat. No. 9,025,103, which is a continuation of application No. 13/946,700, filed on Jul. 19, 2013, now Pat. No. 8,735,901, which is a continuation of application No. 13/568,672, filed on Aug. 7, 2012, now Pat. No. 8,513,701, which is a continuation of application No. 13/067,281, filed on May 20, 2011, now Pat. No. 8,377,765, which is a continuation of application No. 12/662,961, filed on May 13, 2010, now Pat. No. 7,968,357, which is a continuation of application No. 11/802,385, filed on May 22, 2007, now Pat. No. 7,742,113.

(51) Int. Cl.
  *H01L 27/12* (2006.01)
  *H01L 29/786* (2006.01)
  *G02F 1/1335* (2006.01)
  *G02F 1/1368* (2006.01)
  *G02F 1/1343* (2006.01)

(52) U.S. Cl.
  CPC .. *G02F 1/136213* (2013.01); *G02F 1/136227* (2013.01); *H01L 27/124* (2013.01); *H01L 27/1248* (2013.01); *H01L 29/78675* (2013.01); *G02F 1/133504* (2013.01); *G02F 1/133555* (2013.01); *G02F 1/134363* (2013.01); *G02F 2001/13685* (2013.01)

(56) References Cited

U.S. PATENT DOCUMENTS

| | | | |
|---|---|---|---|
| 6,969,872 | B2 | 11/2005 | Kim |
| 7,037,157 | B2 | 5/2006 | Murakami et al. |
| 7,042,024 | B2 | 5/2006 | Yamazaki et al. |
| 7,456,922 | B2* | 11/2008 | Eguchi ............. G02F 1/136227 349/138 |
| 7,649,582 | B2 | 1/2010 | Kim et al. |
| 8,034,466 | B2 | 10/2011 | Sakata et al. |
| 2002/0113926 | A1 | 8/2002 | Hanazawa et al. |
| 2003/0002002 | A1 | 1/2003 | Kawachi et al. |
| 2003/0193054 | A1 | 10/2003 | Hayakawa et al. |
| 2004/0021805 | A1 | 2/2004 | Nagata et al. |
| 2005/0104070 | A1* | 5/2005 | Kim ........................ H01L 27/12 257/72 |
| 2005/0157237 | A1 | 7/2005 | Doi et al. |
| 2005/0270447 | A1 | 12/2005 | Tasaka et al. |
| 2007/0096636 | A1 | 5/2007 | Park et al. |
| 2007/0097303 | A1 | 5/2007 | Sonoda et al. |

FOREIGN PATENT DOCUMENTS

| | | |
|---|---|---|
| JP | 2002-323704 | 11/2002 |
| JP | 2002-328385 | 11/2002 |
| JP | 2003-279967 | 10/2003 |
| JP | 2005-345757 A | 12/2005 |
| JP | 2007-121587 | 5/2007 |

* cited by examiner

MANUFACTURING METHOD FOR LIQUID CRYSTAL DISPLAY DEVICE

CROSS-REFERENCE TO RELATED APPLICATIONS

This application is continuation of U.S. application Ser. No. 14/679,154, filed Apr. 6, 2015, which is a continuation of a U.S. application Ser. No. 14/156,957, filed Jan. 16, 2014, which is a Continuation of U.S. application Ser. No. 13/946,700, filed Jul. 19, 2013, which is a Continuation of U.S. application Ser. No. 13/568,672, filed Aug. 7, 2012, which is a Continuation of U.S. application Ser. No. 13/067,281, filed May 20, 2011, which is a Continuation of U.S. application Ser. No. 12/662,961, filed May 13, 2010, which is a Continuation of U.S. application Ser. No. 11/802,385, filed May 22, 2007. Priority is claimed based on U.S. application Ser. No. 14/679,154, filed Apr. 6, 2015, which claims the priority of U.S. application Ser. No. 14/156,957, filed Jan. 16, 2014, which claims the priority of U.S. application Ser. No. 13/946,700, filed Jul. 19, 2013, which claims the priority of U.S. application Ser. No. 13/568,672, filed Aug. 7, 2012, which claims the priority of U.S. application Ser. No. 13/067,281, filed May 20, 2011, which claims the priority of U.S. application Ser. No. 12/662,961, filed on May 13, 2010, which claims the priority of U.S. application Ser. No. 11/802,385 filed May 22, 2007, which claims the priority date of Japanese Patent Japanese application 2006-160428, filed on Jun. 9, 2006, the content of which is hereby incorporated by reference into this application.

BACKGROUND OF THE INVENTION

1. Field of the Invention

The present invention relates to a liquid crystal display device, and more particularly to a technique which is effectively applicable to a liquid crystal display device which includes a silicon nitride film.

2. Description of Related Art

An active matrix liquid crystal display device forms a holding capacitance in the inside of a pixel for holding a video signal written in the pixel for a relatively long time.

The inventors of the present invention filed a patent application (see following patent document 1) on one method for forming such a holding capacitance.

Figure 7:
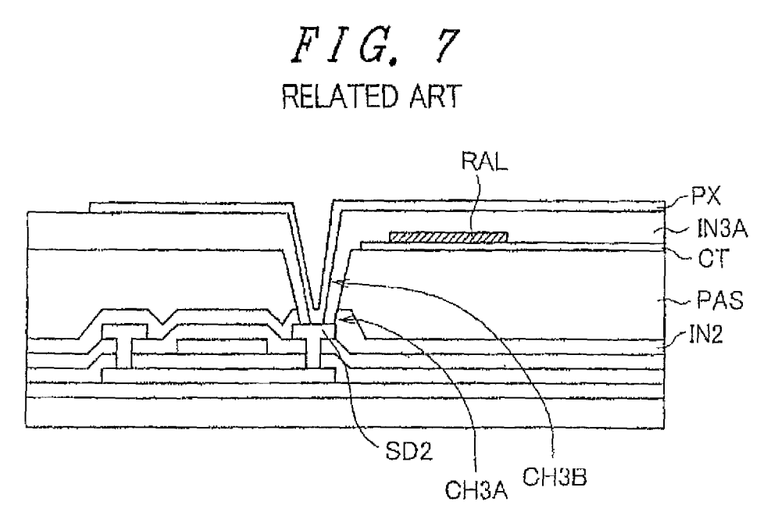
FIG. 7 is a cross-sectional view of an essential part of a liquid crystal display device for showing one example of a holding capacitance described in patent document 1.

FIG. 7 is a cross-sectional view of an essential part showing one example of the holding capacitance described in patent document 1.

As shown in FIG. 7, in an IPS (In-Plane Switching) type liquid crystal display device described in patent document 1, an interlayer insulation film IN2 and an organic insulation film PAS are formed to cover a source electrode SD2 of a thin film transistor in order from below. A contact hole CH3A is formed in the interlayer insulation film IN2 and the organic insulation film PAS in a penetrating manner. A counter electrode CT and a reflection film RAL are formed on the organic insulation film PAS in order from below. Further, an interlayer insulation film IN3A is formed to cover the organic insulation film PAS, the counter electrode CT and the reflection film RAL. The interlayer insulation film IN3A is a coated insulation film or an insulation film formed by a CVD method and is formed also in the inside of the contact hole CH3A. Further, in the interlayer insulation film IN3A, a contact hole CH3B is formed more inside than the contact hole CH3A. A pixel electrode PX is formed on the interlayer insulation film IN3A. Further, the pixel electrode PX is connected with the source electrode SD2 of the thin film transistor via the contact hole CH3B and a video signal is applied to the pixel electrode PX via the thin film transistor. Liquid crystal not shown in the drawing is driven by an electric field generated between the pixel electrode PX and the counter electrode CT thus performing a display of an image.

Here, the holding capacitance is formed by the counter electrode CT (including the reflection film RAL), the interlayer insulation film IN3A and the pixel electrode PX.

Patent Document 1: Japanese patent application no. 2005-312165

SUMMARY OF THE INVENTION

However, in the liquid crystal display device shown in FIG. 7, when the coated insulation film is used as the interlayer insulation film IN3A, the interlayer insulation film IN3A exhibits a dielectric constant which is not so high thus giving rise to a drawback that the holding capacitance cannot be increased.

Further, although patent document 1 describes a technique which forms the interlayer insulation film IN3A by the CVD method in place of the coated insulation film, patent document 1 fails to describe a material of the film.

Further, FIG. 7 shows the structure which exposes the source electrode SD2 through the contact hole CH3A in forming the reflection film RAL by patterning. Accordingly, there exists a possibility that the source electrode SD2 is damaged by etching which is performed for patterning the reflection film RAL using an etchant or an etching gas.

Drawbacks other than the above-mentioned drawbacks will become apparent from the description of the whole specification or drawings.

In the present invention, as an interlayer insulation film above an organic insulation film, a silicon nitride film which is formed at a low temperature is used. Further, in forming a contact hole in the interlayer insulation film formed of the silicon nitride film, it is desirable to collectively etch the interlayer insulation film together with other interlayer insulation film arranged below the interlayer insulation film.

The present invention may adopt the following constitutions, for example.

(1) A liquid crystal display device including a first substrate including a video signal line, a pixel electrode, a thin film transistor having a first electrode thereof connected to the video signal line and a second electrode thereof connected to the pixel electrode, a first silicon nitride film formed above the second electrode, an organic insulation film formed above the first silicon nitride film, a capacitance electrode formed above the organic insulation film, and a second silicon nitride film formed above the capacitance electrode and below the pixel electrode, a second substrate arranged to face the first substrate in an opposed manner, and liquid crystal sandwiched between the first substrate and the second substrate, wherein the second silicon nitride film is a film which is formed at a temperature lower than a forming temperature of the first silicon nitride film, the first silicon nitride film and the second silicon nitride film form a contact hole therein by etching both of the first silicon nitride film and the second silicon nitride film collectively by dry etching, the second electrode and the pixel electrode are connected to each other via the contact hole, a potential different from a potential applied to the pixel electrode is applied to the capacitance electrode, and a holding capacitance is formed by the pixel electrode, the second silicon nitride film and the capacitance electrode.

(2) In the constitution (1), the capacitance electrode may have at least a portion thereof formed of a reflection film.

(3) In the constitution (2), the second electrode may be made of a material which is etched by an etchant or an etching gas used in patterning the reflection film.

(4) In the constitution (2) or (3), the second electrode may include the same material as the reflection film.

(5) In any one of the constitutions (2) to (4), the organic insulation film may have a surface unevenness on a portion thereof corresponding to the reflection film, and the reflection film may have a surface unevenness which reflects the surface unevenness of the organic insulation film.

(6) In the constitution (5), a height of the surface unevenness of the organic insulation film between a crest and a valley may be 0.3 μm or less.

(7) In any one of the constitutions (1) to (6), in the contact hole, a lower surface of the second silicon nitride film may be brought into contact with an upper surface of the first silicon nitride film at least at one portion of the first silicon nitride film.

(8) In any one of the constitutions (1) to (7), in the contact hole, a lower surface of the second silicon nitride film may be brought into contact with an upper surface of the first silicon nitride film over the whole circumference of the contact hole.

(9) In any one of the constitutions (1) to (8), in the contact hole, an end portion of a lower surface of the second silicon nitride film may be substantially aligned with an end portion of an upper surface of the first silicon nitride film.

(10) In any one of the constitutions (1) to (8), in the contact hole, an end portion of a lower surface of the second silicon nitride film may be retracted from an end portion of an upper surface of the first silicon nitride film.

(11) In any one of the constitutions (1) to (10), in the contact hole, the organic insulation film may not be exposed from the second silicon nitride film.

(12) In any one of the constitutions (1) to (11), the capacitance electrode may have at least a portion thereof formed of a transparent conductive film.

(13) In any one of the constitutions (1) to (12), the pixel electrodes may be formed of a transparent conductive film.

(14) In any one of the constitutions (1) to (13), the second silicon nitride film may be formed of a film which exhibits an etching rate in the vicinity of a surface thereof faster than the etching rate in other portion thereof.

(15) In the constitution (14), a film thickness of a portion of the second silicon nitride film arranged in the vicinity of the surface of the second silicon nitride film which exhibits the etching rate faster than the etching rate of other portion of the second silicon nitride film may be set to a value not less than 5% and not more than 30% of a film thickness of the second silicon nitride film.

(16) In any one of the constitutions (1) to (15), the second silicon nitride film may be a film formed by a plasma CVD method.

(17) In any one of the constitutions (1) to (16), the capacitance electrode may also function as a counter electrode and the liquid crystal may be driven by an electric field generated between the pixel electrode and the counter electrode.

(18) In any one of the constitutions (1) to (16), the second substrate may include a counter electrode and the liquid crystal may be driven by an electric field generated between the pixel electrode and the counter electrode.

(19) A liquid crystal display device including a first substrate including a video signal line, a pixel electrode, a thin film transistor having a first electrode thereof connected to the video signal line and a second electrode thereof connected to the pixel electrode, an organic insulation film formed above the second electrode, a capacitance electrode formed above the organic insulation film, and a silicon nitride film formed above the capacitance electrode and below the pixel electrode, a second substrate arranged to face the first substrate in an opposed manner, and liquid crystal sandwiched between the first substrate and the second substrate, wherein the silicon nitride film is a film which is formed at a temperature lower than a heat-resistant temperature of the organic insulation film after the formation of the organic insulation film, and a potential different from a potential applied to the pixel electrode is applied to the capacitance electrode, and a holding capacitance is formed by the pixel electrode, the silicon nitride film and the capacitance electrode.

(20) In the constitution (19), the silicon nitride film may be a film formed by a plasma CVD method.

(21) A liquid crystal display device including a first substrate including a video signal line, a pixel electrode, a thin film transistor having a first electrode thereof connected to the video signal line and a second electrode thereof connected to the pixel electrode, an organic insulation film formed above the thin film transistor, a reflection film formed above the organic insulation film, a silicon nitride film formed above the reflection film and below the pixel electrode, a second substrate arranged to face the first substrate in an opposed manner, and liquid crystal sandwiched between the first substrate and the second substrate, wherein the organic insulation film has a surface unevenness on a portion thereof corresponding to the reflection film, the reflection film has a surface unevenness which reflects the surface unevenness of the organic insulation film, the silicon nitride film is formed at a temperature lower than a heat-resistant temperature of the organic insulation film after the formation of the organic insulation film, and a height of the surface unevenness of the organic insulation film between a crest and a valley is 0.3 or less.

(22) In the constitution (21), the silicon nitride film may be a film formed by a plasma CVD method.

Here, the above-mentioned constitutions are exemplified only as examples and the present invention can be suitably modified without departing from a technical concept of the present invention. Further, examples of the constitution of the present invention besides the above-mentioned constitutions will become apparent from the description of the whole specification or drawings.

To explain typical advantageous effects of the present invention, they are as follows.

According to the present invention, it is possible to form a holding capacitance which exhibits a large capacitance.

Further, the present invention can prevent damages from being applied to the source electrode.

Further, according to the present invention, the process can be simplified.

Further, according to the present invention, it is possible to ensure the electric connection in the contact hole.

BRIEF DESCRIPTION OF THE DRAWINGS

FIG. 4A to FIG. 4F are views for explaining manufacturing method of the liquid crystal display device of the embodiment 1 of the present invention;

FIG. 6A to FIG. 6C are views for explaining a liquid crystal display device of an embodiment 3 of the present invention, and also are cross-sectional views showing a contact hole portion in an enlarged manner.

DESCRIPTION OF THE PREFERRED EMBODIMENTS

Embodiments of the present invention are explained in conjunction with drawings.

Embodiment 1

In an embodiment 1, the explanation is made with respect to one example in which the present invention is applied to an IPS liquid crystal display device.

Figure 1:
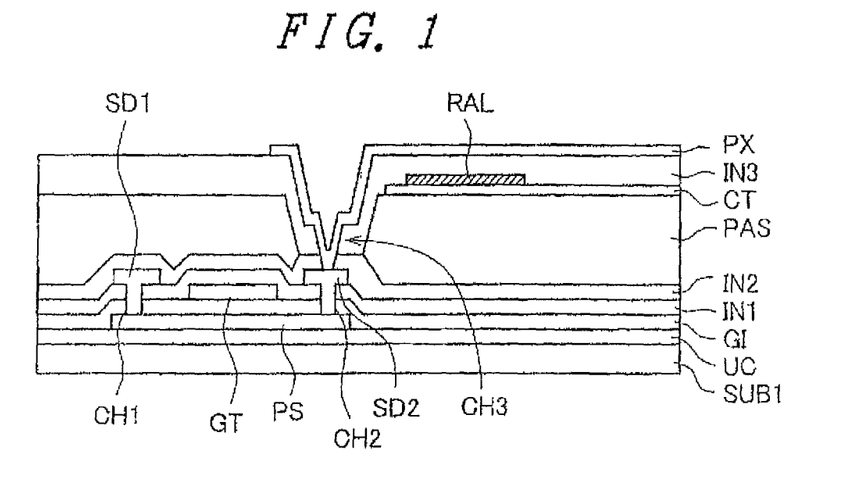
FIG. 1 is a view for explaining a liquid crystal display device of an embodiment 1 of the present invention and also is a cross-sectional view taken along a line A-A' in FIG. 2.
Figure 2:
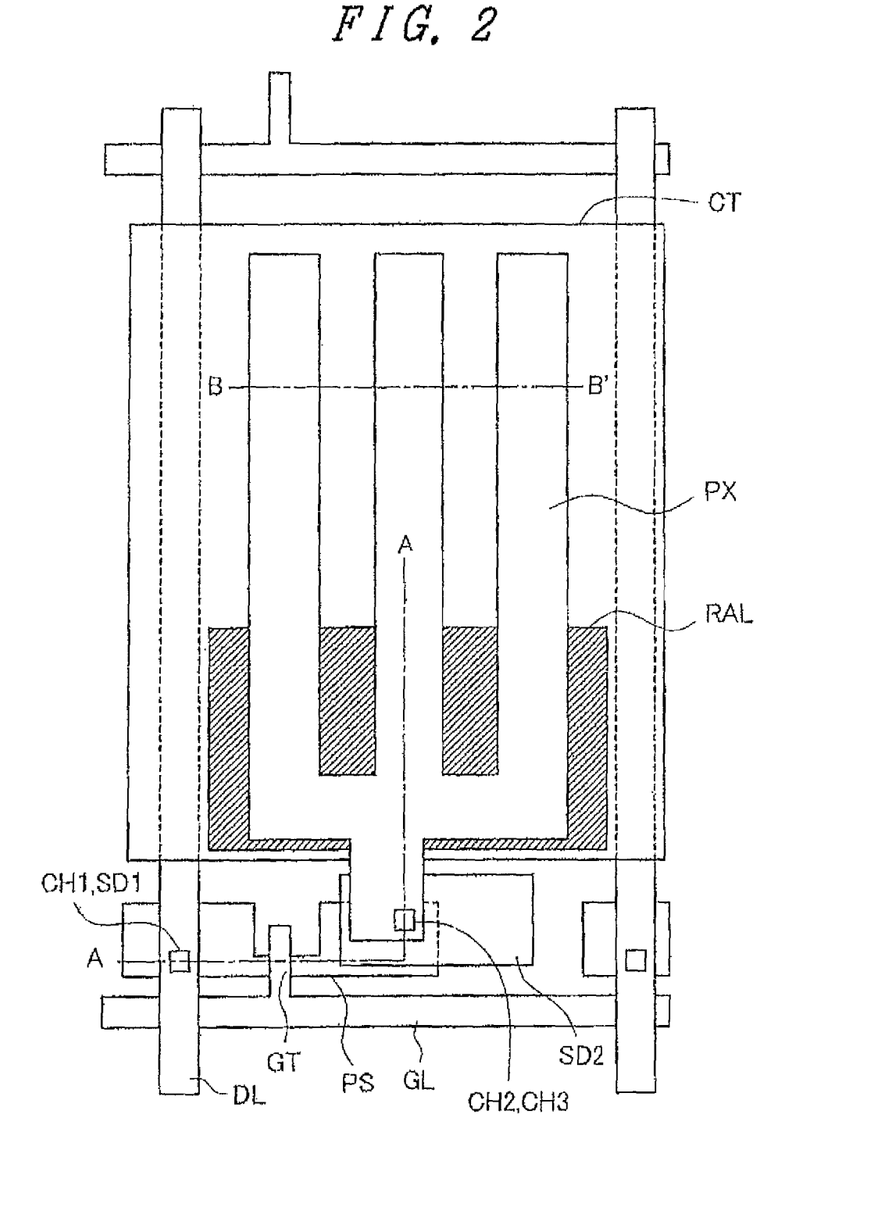
FIG. 2 is a plan view for explaining the liquid crystal display device of the embodiment 1 of the present invention.
Figure 3:
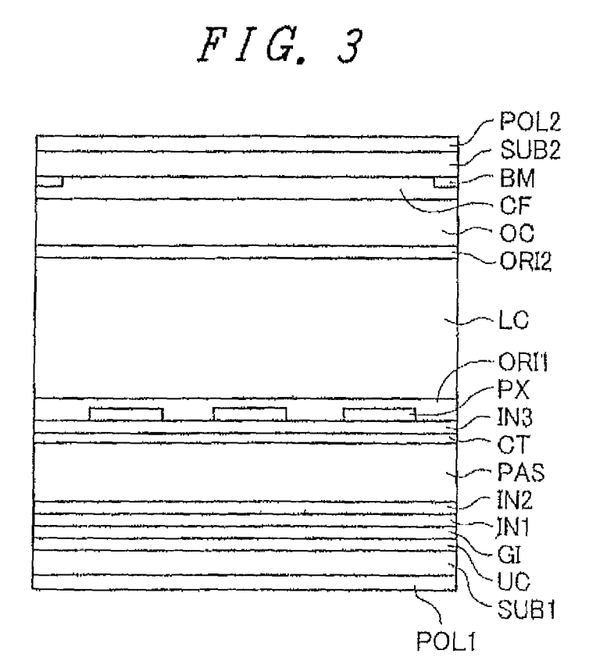
FIG. 3 is a view for explaining the liquid crystal display device of the embodiment 1 of the present invention, and also is a cross-sectional view taken along a line B-B' in FIG. 2.

FIG. 1 is a view for explaining a liquid crystal display device of the embodiment 1 of the present invention and also is a cross-sectional view taken along a line A-A' in FIG. 2. FIG. 2 is a plan view for explaining the liquid crystal display device of the embodiment 1 of the present invention. FIG. 3 is a view for explaining the liquid crystal display device of the embodiment 1 of the present invention and also is a cross-sectional view taken along a line B-B' in FIG. 2.

As shown in FIG. 1 to FIG. 3, liquid crystal LC is sandwiched between a transparent insulation substrate (first substrate) SUB1 made of a glass or the like and a transparent insulation counter substrate (second substrate) SUB2 made of a glass or the like.

The liquid crystal display device according to the present invention is an active matrix type liquid crystal display device in which a plurality of pixels are arranged in a matrix array. The substrate SUB1 includes a plurality of scanning signal lines GL and a plurality of video signal lines DL which intersect the plurality of scanning signal lines GL. In the vicinity of each intersection, a thin film transistor is arranged as a switching element of the pixel. In FIG. 2, one pixel out of a plurality of pixels which are arranged in a matrix array is shown.

On the substrate SUB1, in order from below, a base film UC, a semiconductor film PS made of poly-silicon or the like, a gate insulation film GI, gate electrodes GT of the thin film transistors, and an interlayer insulation film IN1 are formed. On the interlayer insulation film IN1, drain electrodes (first electrodes) SD1 of the thin film transistors and source electrodes (second electrodes) SD2 of the thin film transistors are formed. Here, there may be a case that SD1 may be used to refer to the source electrodes. In such a case, SD2 may be used to refer to the drain electrodes. In this specification, SD1 is used to refer to the drain electrodes.

The gate electrodes GT are integrally formed with the scanning signal line GL. One portion of the video signal line DL also functions as the drain electrode SD1 thus providing the structure in which the video signal line DL and the drain electrode SD1 are connected with each other. The drain electrode SD1 is connected to the drain region of the thin film transistor via the contact hole CH1 which is formed in the gate insulation film GI and the interlayer insulation film IN1. The source electrode SD2 is connected to a source region of the thin film transistor via a contact hole CH2 formed in the gate insulation film GI and the interlayer insulation film IN1.

On the drain electrodes SD1 and the source electrodes SD2, an interlayer insulation film IN2 is formed. On the interlayer insulation film IN2, an organic insulation film PAS is formed. On the organic insulation film PAS, counter electrodes CT and a reflection film RAL are formed. On the counter electrodes CT and the reflection film RAL, an interlayer insulation film IN3 is formed. On the interlayer insulation film IN3, pixel electrodes PX are formed. The pixel electrodes are connected to the source electrodes SD2 of the thin film transistors via contact holes CH3 which are formed in the interlayer insulation film IN2 and the interlayer insulation film IN3.

On the pixel electrodes PX, an orientation film ORI1 is formed. Further, on a side of the substrate SUB1 opposite to the liquid crystal LC, a polarizer POL1 is arranged. Here, the orientation film ORI1 and the polarizing plate POL1 are omitted from FIG. 1.

On the counter substrate SUB2, a black matrix BM, color filters CF, an overcoat film OC, an orientation film ORI2 are formed. Further, a polarizer POL2 is arranged on a side of the counter substrate SUB2 opposite to the liquid crystal LC.

A retardation plate or a coated retardation layer may be arranged on at least one of the substrate SUB1 and the counter substrate SUB2 when necessary.

In this embodiment, the pixel electrode PX includes a linear portion and is formed into a comb-teeth shape. The counter electrode CT is formed in a planar shape. Here, the liquid crystal LC is driven by an electric field which is generated between the pixel electrode PX and the counter electrode CT to perform a display.

The pixel electrode PX and the counter electrode CT are formed of a transparent conductive film such as an ITO film, for example. The reflection film RAL is formed in one region within one pixel. Due to such a constitution, it is possible to perform a transflective (partially transmissive) display which includes a transmissive region and a reflection region in one pixel. Accordingly, it is possible to perform a transmissive display by making use of light from a backlight not shown in the drawing under a dark environment, while it is possible to perform a reflective display by making use of an external light under a bright environment. The reflection film RAL has, for example, the two-layered structure which has a lower layer thereof made of molybdenum tungsten alloy (MoW) and an upper layer thereof made of an aluminum silicon alloy (AlSi) containing 1% of Si, and the reflection film RAL is connected to the counter electrode CT. When it is necessary to change a thickness of the liquid crystal LC in the transmissive region and a thickness of the liquid crystal in the reflection region, for example, it is preferable to form a stepped-portion forming layer not shown in the drawing on the counter substrate SUB2.

A common potential different from a potential applied to the pixel electrodes PX is applied to the counter electrode CT (and the reflection film RAL). Accordingly, the holding capacitance is formed by the counter electrode CT (and the reflection film RAL), the pixel electrodes PX and the interlayer insulation film IN3. That is, the counter electrode CT (and the reflection film RAL) also functions as a capacitance electrode. Here, when a silicon nitride film is used as the interlayer insulation film IN3, compared to a case in which a coated insulation film IN3A is used as the interlayer insulation film IN3 which is explained in conjunction with FIG. 7, or a case in which a silicon oxide film is used as the interlayer insulation film IN3, a high dielectric constant can be obtained. Accordingly, it is possible to increase the holding capacitance. Further, by forming the pixel electrodes PX and the counter electrode CT using a transparent conductive film, it is possible to form a transparent holding capacitance and hence, a numerical aperture at the time of performing a transmissive display can be increased.

The interlayer insulation film IN2 may preferably be a silicon nitride film which is formed by a plasma CVD method. It is desirable that the interlayer insulation film IN2 is formed at a high temperature to obtain a dense film. The organic insulation film PAS may preferably be formed using a photosensitive acrylic resin or the like, for example. With the use of the organic insulation film PAS, it is possible to increase the flatness compared a case in which an inorganic insulation film is used as the interlayer insulation film IN2. Further, the organic insulation film PAS having a large thickness can be easily formed and hence, it is possible to decrease the parasitic capacitance. Further, by making use of a halftone exposure when necessary, the surface unevenness may be partially formed on the organic insulation film PAS easily.

The interlayer insulation film IN3 is formed above the organic insulation film PAS. The organic insulation film PAS generally has comparatively low heat resistance and hence, in this embodiment, the interlayer insulation film IN3 is formed by a plasma CVD method at a temperature lower than a forming temperature of the interlayer insulation film IN2. To make the dielectric constant high, a silicon nitride film is adopted as the interlayer insulation film IN3. The interlayer insulation film IN3 is formed at a low temperature and hence, the interlayer insulation film IN3 is not as dense as the interlayer insulation film IN2. However, due to the provision of the dense interlayer insulation film IN2, there arises no problem in practical use in the protection of the thin film transistor.

Further, a silicon nitride film is adopted by both of the interlayer insulation film IN2 and the interlayer insulation film IN3 and hence, both of the interlayer insulation films IN2 and IN3 can be collectively etched by dry etching to form the contact hole CH3 therein. Accordingly, it is possible to simplify the processing.

The source electrode SD2 is made of the same material (for example, an aluminum silicon alloy or a molybdenum tungsten alloy) as the reflection film RAL. In this case, in the structure explained in conjunction with FIG. 7, the source electrode SD2 is exposed at the time of forming the reflection film RAL and hence, there exists a drawback that the source electrode SD2 may be damaged by an etchant or an etching gas which is used for forming (patterning) the reflection film RAL. On the other hand, by collectively etching the interlayer insulation film IN2 and the interlayer insulation film IN3 in the same manner as this embodiment, the source electrode SD2 is covered with the interlayer insulation film IN2 at the time of forming the reflection film RAL and hence, it is possible to avoid the above-mentioned problem.

Next, one example of a manufacturing method of the liquid crystal display device of this embodiment is explained. FIG. 4A to FIG. 4F are views for explaining the manufacturing method of the embodiment 1 of the liquid crystal display device of the present invention. FIG. 4A to FIG. 4F illustrate the vicinity of the contact hole CH3 in FIG. 1 in an enlarged manner.

Figure 4A:
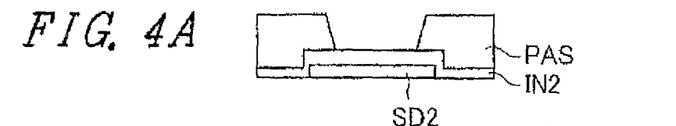

As shown in FIG. 4A, after the thin film transistors are formed by a usual method, a silicon nitride film is formed on the source electrodes SD2 as the interlayer insulation film IN2 using a plasma CVD method. With respect to the forming condition of the interlayer insulation film IN2 at this time, the forming temperature (substrate temperature) is set to 390° C. and the film thickness of the interlayer insulation film IN2 is set to 300 nm.

Thereafter, the organic insulation film PAS is formed, for example, by coating, exposing and patterning a photosensitive, acrylic resin. A thickness of the organic insulation film PAS is set to 2.2 μm.

Figure 4B:
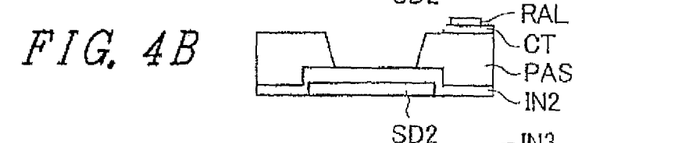

Next, as shown in FIG. 4B, the counter electrodes CT made of ITO and having a film thickness of 77 nm are formed on the organic insulation film PAS by patterning. On the counter electrodes CT, the reflection film RAL having the two-layered structure including upper layer made of an aluminum silicon alloy (AlSi) containing 1% of Si having a thickness of 150 nm and a lower layer made of a molybdenum tungsten alloy (MoW) having a thickness of 50 nm is formed by patterning. For patterning the reflection film RAL, a mixed acid formed by mixing a phosphoric acid, a nitric acid, an acetic acid and ammonium fluoride is used as an etchant. Here, the source electrode SD2 has the three-layered structure including an upper layer made of a molybdenum tungsten alloy (MoW) having a thickness of 75 nm, an intermediate layer made of an aluminum silicon alloy (AlSi) containing 1% of Si and having a thickness of 500 nm and a lower layer made of a molybdenum tungsten alloy (MoW) having a thickness of 40 nm and has the same materials as the materials of the reflection film RAL. However, at this point of time, the source electrode SD2 is covered with the interlayer insulation film IN2 and hence, there is no possibility that the source electrode SD2 is damaged.

Here, even when the source electrode SD2 and the reflection film RAL may not be formed of the same material, when the source electrode SD2 is made of a material which is etched by the etchant or the etching gas used for patterning the reflection film RAL, there arises similar drawbacks and hence, it is preferable that the source electrode SD2 is not exposed at the time of forming the reflection film RAL. For example, a case in which the upper layer of the source electrode SD2 is made of titanium (Ti) or the like may be considered.

Figure 4C:
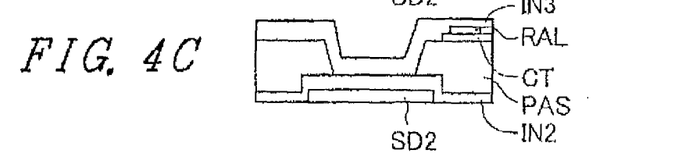

Next, as shown in FIG. 4C, a silicon nitride film is formed on the counter electrodes CT and the reflection film RAL as the interlayer insulation film IN3 formed by the plasma CVD method. With respect to the forming condition at this point of time, by taking influence exerted upon the organic insulation film PAS arranged below the interlayer insulation film IN3 into consideration, the interlayer insulation film IN3 is formed at a temperature lower than the heat-resistant temperature of the organic insulation film PAS, and the film forming temperature (substrate temperature) is set to 180° C. to 250° C. (preferably 220° C. to 230° C., especially 220° C.), and the film thickness is set to 100 nm to 500 nm (preferably 200 nm to 300 nm, especially 300 nm).

Further, it is desirable to set an etching rate of the vicinity of a surface the interlayer insulation film IN3 faster than an etching rate of other portions (bulk layers) of the interlayer insulation film IN3. This can be obtained by setting a gas flow rate between mono-silane ($SiH_4$) and ammonia ($NH_3$) which are material gasses of the interlayer insulation film IN3 at the time of forming by a plasma CVD to 1:6 in forming a usual bulk layer of the interlayer insulation film IN3 and by increasing the gas flow rate to 1:16 in the course of the step for forming the interlayer insulation film IN3, for example. It is desirable to set a film thickness of the interlayer insulation film IN3 in the vicinity of the surface of the interlayer insulation film IN3 having the etching rate faster than the etching rate of other portion to a value equal to or more than 5% and equal to or less than 30% (preferably approximately 8% to 12%) of the film thickness of the interlayer insulation film IN3. In this manner, by forming the film having the fast etching rate (retracted layer) in the vicinity of the surface of the interlayer insulation film IN3, it is possible to form the contact hole CH3 into a normal tapered shape at the time of forming the contact hole CH3.

Figure 4D:
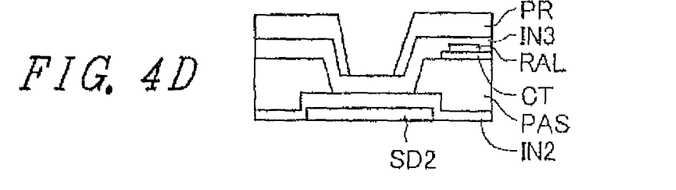

Next, as shown in FIG. 4D, a resist PR is formed.

Figure 4E:
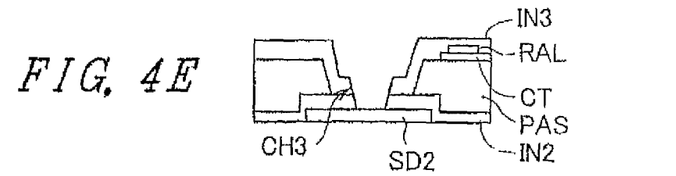

Then, as shown in FIG. 4E, using the resist PR as a mask, the interlayer insulation film IN2 and the interlayer insulation film IN3 are collectively etched thus forming the contact holes CH3. Using a mixed gas made of sulfur hexafluoride ($SF_6$) and oxygen ($O_2$) as an etching gas, the interlayer insulation film IN2 and the interlayer insulation film IN3 are etched by dry etching. By collectively etching both of the interlayer insulation film IN2 and the interlayer insulation film IN3, the processing can be simplified.

Thereafter, the resist PR is removed.

Figure 4F:
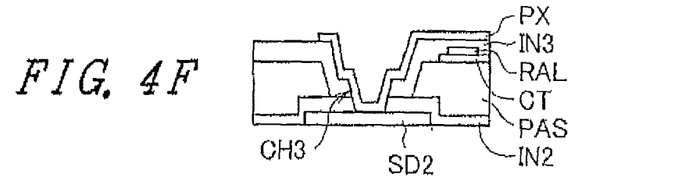

Next, as shown in FIG. 4F, the pixel electrodes PX made of ITO are formed on the interlayer insulation film IN3. A film thickness of the pixel electrode PX is set to 77 nm.

Here, in this embodiment, a case in which the interlayer insulation film IN2 is formed on the drain electrodes SD1 and the source electrodes SD2 has been explained. However, depending on a degree of requirement of reliability or the like, the interlayer insulation film IN2 is not a layer which is always necessary. That is, even when the organic insulation film PAS is directly formed on the drain electrode SD1 and the source electrode SD2, such a constitution can obtain the advantageous effects of the present invention that the holding capacitance can be increased. Here, in this case, in place of eliminating the interlayer insulation film IN2, it is preferable to form the interlayer insulation film IN1 using a silicon nitride film or a stacked film including a silicon nitride film (for example, the two-layered structure formed of a silicon oxide film and the silicon nitride film).

Further, in forming the interlayer insulation film IN2, in this embodiment, the explanation has been made with respect to the case in which the interlayer insulation film IN2 is formed of the silicon nitride film. However, the constitution is not limited to such a case and the interlayer insulation film IN2 may be formed of a silicon oxide film. Here, also in this case, it is preferable that the interlayer insulation film IN1 is formed of a silicon nitride film or a stacked film including a silicon nitride film (for example, the two-layered structure formed of the silicon oxide film and the silicon nitride film).

Embodiment 2

Figure 5:
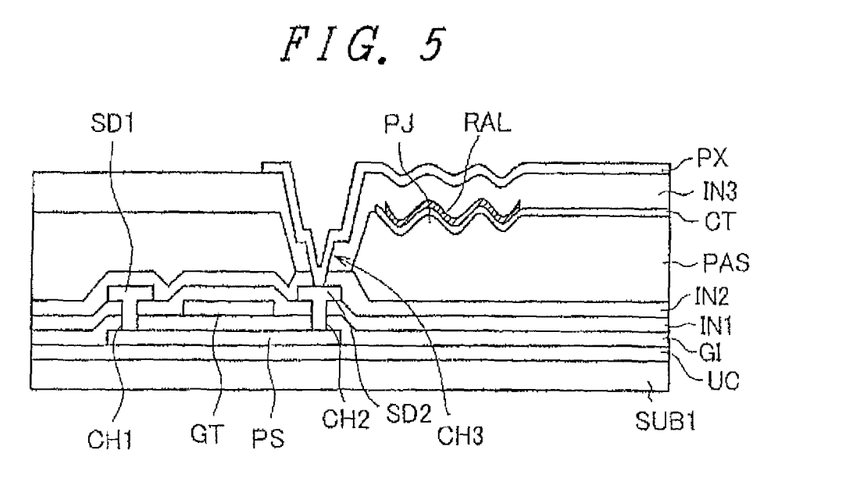
FIG. 5 is a view for explaining a liquid crystal display device of an embodiment 2 of the present invention, and also is a view which corresponds to FIG. 1.

In the embodiment 2, one example in which the formation of a surface unevenness to perform a diffusion reflection is applied to the constitution of the embodiment 1 is explained. FIG. 5 is a view for explaining the embodiment 2 of the liquid crystal display device according to the present invention, and also is a view corresponding to FIG. 1. Here, in this embodiment and succeeding embodiments which follow the embodiment 2, points makes these embodiments different from the embodiment 1 are mainly explained and the explanation of contents common with the contents of the embodiment 1 is omitted.

The constitution which makes the embodiment 2 different from the constitution of the embodiment 1 lies in that the surface unevenness (projections PJ) is formed on a portion of the organic insulation film PAS corresponding to the reflection film RAL by making use of a halftone exposure, for example, and the reflection film RAL has an uneven surface shape by reflecting the surface unevenness of the organic insulation film PAS. Due to such a constitution, it is possible to perform a diffusion reflection in the reflection display and hence, a display quality is enhanced.

The organic insulation film PAS is used for forming the surface unevenness and hence, it is possible to easily form the surface unevenness compared to a case in which the surface unevenness is formed an inorganic insulation film.

However, when the interlayer insulation film IN3 is used of a film formed by the plasma CVD method, it is not possible to sufficiently level the surface unevenness and hence, the surface unevenness is also reflected on the pixel electrodes PX. To decrease the influence of the surface unevenness on the display quality, it is preferable to set a height of the surface unevenness between a crest and a valley of the organic insulation film PAS to a value equal to or less than 0.3 μm (more preferably, equal to or less than 0.2 μm). Here, to obtain a function of diffusion reflection, it is preferable to set the height of the surface unevenness between a crest and a valley to a value equal to or more than 0.1 μm.

Embodiment 3

The embodiment 3 describes a modification of a shape of the contact hole CH3 of the present invention.

Figure 6A:
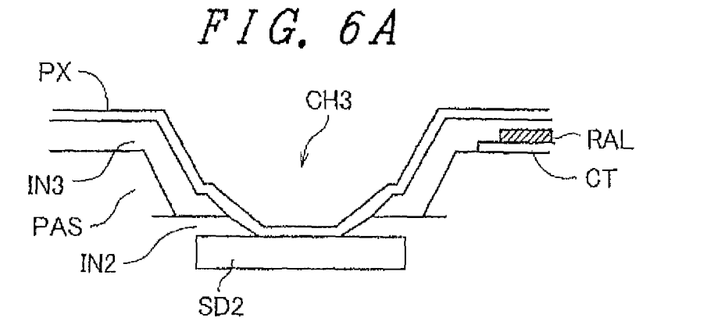
Figure 6B:
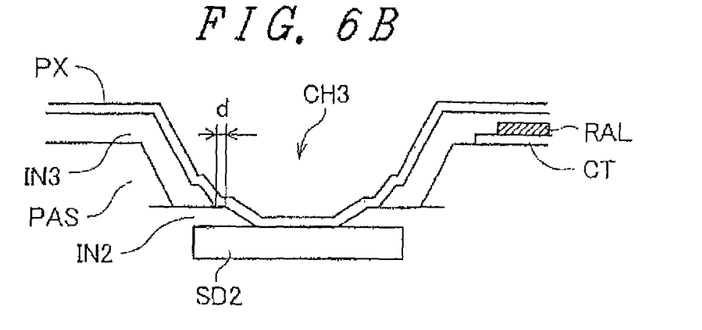
Figure 6C:
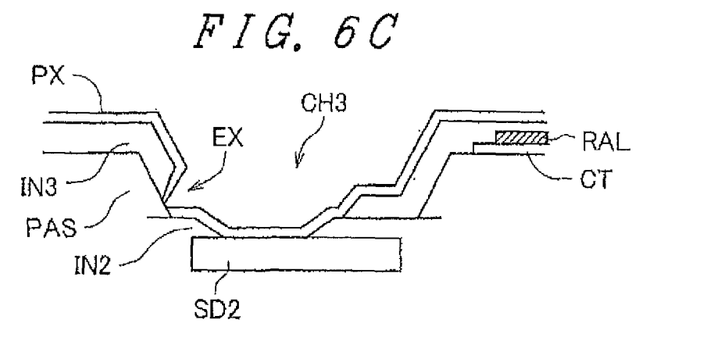

FIG. 6A to FIG. 6C are views for explaining the embodiment 3 of the present invention, and also are cross-sectional views showing the contact hole portion in an enlarged manner.

As shown in FIG. 6A and FIG. 6B, in the contact hole CH3, it is desirable that an organic insulation film PAS is not exposed from an interlayer insulation film IN3. That is, in the contact hole CH3, it is desirable that a lower surface of the interlayer insulation film IN3 is brought into contact with an upper surface of an interlayer insulation film IN2 over the whole circumference.

As shown in FIG. 6C, at an exposed portion EX where the organic insulation film PAS is exposed from the interlayer insulation film IN3, a pixel electrode PX formed on the interlayer insulation film IN3 may possess a high resistance or is liable to be easily disconnected. Such an exposed portion PX is formed due to the following reason.

In a stage before etching the interlayer insulation film IN3 by dry etching, at a portion of an inclined surface of the organic insulation film PAS, the interlayer insulation film IN3 per se forms an inclined surface which is inclined with respect to a substrate SUB1. When the dry etching is performed, the interlayer insulation film IN3 is etched with a predetermined taper angel and this angle assumes a fixed angle with respect to an upper surface of the interlayer insulation film IN3. Accordingly, an etched end surface of the interlayer insulation film IN3 positioned on the inclined surface as shown in FIG. 6C increases an angle measured using a main surface of the substrate SUB1 as the reference compared to a case in which the interlayer insulation film IN3 is formed on a horizontal surface as shown in FIG. 6A and FIG. 6B. Further, depending on a case, the etched end surface may take a reverse tapered state as shown in FIG. 6C. Due to such a reason, a shape which generates the exposed portion EX is formed.

Here, in FIG. 6C, although the exposed portion EX is formed on a left side of the cross-sectional view of the contact hole CH3, the organic insulation film PAS is not exposed from the interlayer insulation film IN3 on a right side of the cross-sectional view. Such a structure is brought about by the misalignment of the resist PR explained in conjunction with FIG. 4D. When at least one connection path where the exposed portion EX is not present is ensured, although the resistance may be increased, the electrical connection can be established and hence, such a shape may be adopted provided that there arises no problem in display. The shape can be realized by bringing a lower surface of the interlayer insulation film IN3 into contact with an upper surface of the interlayer insulation film IN2 at least one portion of the contact hole CH3.

In FIG. 6A, an end portion of the lower surface of the interlayer insulation film IN3 and an end portion of the upper surface of the interlayer insulation film IN2 substantially agree with each other. That is, a taper of the interlayer insulation film IN3 and a taper of the interlayer insulation film IN2 are contiguously formed.

In FIG. 6B, the end portion of the lower surface of the interlayer insulation film IN3 is retracted from the end portion of the upper surface of the interlayer insulation film IN2 by a distance d. Due to such a constitution, a stepped portion can be made small and hence, the possibility of the occurrence of disconnection of the pixel electrode PX can be reduced and, at the same time, a thickness of the pixel electrode PX in a film shape can be decreased. By increasing an etching rate of the interlayer insulation film IN3 compared to an etching rate adopted by the structure shown in FIG. 6A, such a shape can be realized.

Embodiment 4

This embodiment 4 is directed to a case in which the present invention is applied to a transmissive liquid crystal display device.

Here, the formation of the reflection film RAL in the embodiment 1 may be omitted.

Further, in this case, a portion of the contact hole CH3 may be configured such that, in place of the structure explained in conjunction with FIG. 1, as explained in conjunction with FIG. 7, the contact hole CH3A is preliminarily formed in the interlayer insulation film IN2 and, thereafter, the contact hole CH3B may be formed in the interlayer insulation film IN3A. Also in such a case, it is possible to obtain an advantageous effect that the holding capacitance can be increased by using the silicon nitride film as the interlayer insulation film IN3.

This embodiment may also adopt the shape of the contact hole explained in conjunction with the embodiment 3.

Embodiment 5

This embodiment 5 explains a case in which the present invention is applied to a vertical electric field liquid crystal display device in place of the IPS liquid crystal display device explained in conjunction with the embodiment 1.

In the vertical electric field liquid crystal display device, a counter electrode not shown in the drawing may be formed on the counter substrate SUB2 side. Due to such a constitution, the liquid crystal display device can perform a display by driving liquid crystal LC using an electric field generated between pixel electrode PX on the substrate SUB1 side and the counter electrode not shown in the drawing on the counter electrode SUB2 side. Here, the pixel electrodes PX may be formed in a planar shape instead of a comb-teeth-shape shown in FIG. 2.

In the vertical electric field liquid crystal display device of this embodiment, the counter electrode CT (and the reflection film RAL) shown in FIG. 1 functions as capacitive electrode instead of counter electrode.

Here, this embodiment may be combined with the embodiment 2 to perform the diffusion reflection.

Further, this embodiment may adopt the shape of the contact hole shown in the embodiment 3.

Further, a transmissive liquid crystal display device may be constituted by combining this embodiment with the embodiment 4.

Here, the constitutions which have been explained in conjunction with the respective embodiments heretofore merely constitute examples and various modifications can be properly made without departing from a technical concept of the present invention.

What is claimed is:

1. A display device comprising: a substrate;
   a first inorganic insulation film above the substrate, having a first hole in a contact region;
   an organic insulation film above the first inorganic insulation film, having a second hole in the contact region; and
   a second inorganic insulation film above the organic insulating film, covering a sidewall of the second hole, and having a third hole in the contact region, wherein
   the first inorganic insulation film contacts the second inorganic insulation film without the organic insulation film therebetween in the contact region.

2. The display device according to claim 1, further comprising a first transparent conductive film and a metal portion, wherein
   the first transparent conductive film is above the organic insulation film and is below the second inorganic insulation film,
   the metal portion contacts the first transparent conductive film.

3. The display device according to claim 2, wherein the metal portion has at least two-layered structure including a upper layer and a lower layer.

4. The display device according to claim 3, wherein the lower layer of the metal portion contacts the first transparent conductive film.

5. The display device according to claim 3, wherein the upper layer of the metal portion includes a material at least containing an aluminum.

6. The display device according to the claim 5, wherein the lower layer of the metal portion includes a material at least containing a molybden or tungsten.

7. The display device according to claim 3, wherein a thickness of the upper layer is larger than a thickness of the lower layer.

8. The display device according to claim 2, wherein the first transparent conductive film and the metal portion are located near the contact region and not overlapped to the second hole.

9. The display device according to claim 8, further comprising:
   a display area performing a display of an image, wherein the display area has a plurality of the contact region, and the plurality of the contact region are arranged in a matrix form, the metal portion is located between the two contact regions.

10. The display device according to claim 2, further comprising a second transparent conductive film above the second insulation film, wherein
the second transparent conductive film covers a sidewall of the first hole and a sidewall of the third hole.

11. The display device according to the claim 10, wherein the second transparent conductive film is not contacted to the sidewall of the second hole.

* * * * *